(12) United States Patent
Iwakiri et al.

(10) Patent No.: US 11,622,478 B2
(45) Date of Patent: Apr. 4, 2023

(54) POWER CONVERTER HAVING IMPROVED COOLING

(71) Applicant: Mitsubishi Electric Corporation, Tokyo (JP)

(72) Inventors: Taisuke Iwakiri, Tokyo (JP); Hirotaka Oyama, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/830,511

(22) Filed: Mar. 26, 2020

(65) Prior Publication Data

US 2020/0359533 A1 Nov. 12, 2020

(30) Foreign Application Priority Data

May 9, 2019 (JP) .............................. JP2019-088746

(51) Int. Cl.
*H05K 7/20* (2006.01)
*H01G 2/08* (2006.01)
(Continued)

(52) U.S. Cl.
CPC ........... *H05K 7/20927* (2013.01); *H01G 2/08* (2013.01); *H01G 4/224* (2013.01); *H01L 23/373* (2013.01);
(Continued)

(58) Field of Classification Search
CPC ........... H05K 7/20472; H05K 7/20509; H05K 7/209; H01G 2/08
See application file for complete search history.

(56) References Cited

U.S. PATENT DOCUMENTS 6,768,056 B2 * 7/2004 Fischer ..................... H01G 2/08
174/50
7,864,506 B2 * 1/2011 Pal ........................... H01G 9/08
361/311
(Continued)

FOREIGN PATENT DOCUMENTS

JP 2008-061476 A 3/2008
JP 2008-067546 A 3/2008
(Continued)

OTHER PUBLICATIONS

Communication dated Aug. 4, 2020, from the Japanese Patent Office in Application No. 2019-088746.
(Continued)

*Primary Examiner* — Zachary Pape
(74) *Attorney, Agent, or Firm* — Sughrue Mion, PLLC; Richard C. Turner

(57) ABSTRACT

Provided is a power converter which enables improved performance, and allows each of a semiconductor module and a capacitor module to be more reliably cooled. In a power converter, a capacitor module includes a capacitor module main body facing a cooling surface of a cooler, while being apart from the cooling surface, and a heat conductive member provided in the capacitor module main body. The capacitor module main body is connected to a semiconductor module via an N-side bus bar and a P-side bus bar. A heat radiation portion of the heat conductive member is thermally connected to the cooling surface at a position more distant from the semiconductor module than an end portion of the capacitor module main body which is closer to the semiconductor module.

5 Claims, 5 Drawing Sheets

(51) Int. Cl.
   *H01G 4/224*   (2006.01)
   *H01L 23/373*  (2006.01)
   *H01L 23/473*  (2006.01)
   *H02M 7/00*    (2006.01)
   *H02M 7/48*    (2007.01)

(52) U.S. Cl.
   CPC .......... *H01L 23/473* (2013.01); *H02M 7/003* (2013.01); *H02M 7/48* (2013.01); *H05K 7/209* (2013.01)

(56) References Cited

U.S. PATENT DOCUMENTS

| | | | | |
|---|---|---|---|---|
| 8,422,230 B2 * | 4/2013 | Aiba | ........................ | H05K 7/20 361/704 |
| 9,756,755 B2 * | 9/2017 | Harada | ................ | H05K 7/1432 |
| 10,084,388 B2 * | 9/2018 | Takahashi | ............. | H02M 7/003 |
| 10,410,795 B2 * | 9/2019 | Werker | ................... | F04B 29/00 |
| 10,490,469 B2 * | 11/2019 | Tani | ........................ | H02M 7/48 |
| 10,498,250 B2 * | 12/2019 | Takahashi | ................ | H05K 5/04 |
| 2020/0328026 A1 * | 10/2020 | Nguyen | .................... | H01G 4/38 |
| 2021/0044213 A1 * | 2/2021 | Kojima | .................. | H01G 2/106 |

FOREIGN PATENT DOCUMENTS

| | | | | | |
|---|---|---|---|---|---|
| JP | 2010-187504 | A | | 8/2010 | |
| JP | 2013-146179 | A | | 7/2013 | |
| JP | 2013146179 | A | * | 7/2013 | |
| JP | 2017-108524 | A | | 6/2017 | |
| JP | 2017-188998 | A | | 10/2017 | |
| WO | WO-2017072870 | A1 | * | 5/2017 | ............. H01L 25/16 |
| WO | 2019021532 | A1 | | 1/2019 | |

OTHER PUBLICATIONS

Notification of reasons for refusal dated May 19, 2020, from the Japanese Patent Office in Application No. 2019-088746.

* cited by examiner

POWER CONVERTER HAVING IMPROVED COOLING

BACKGROUND OF THE INVENTION

Field of the Invention

The present invention relates to a power converter including a semiconductor module and a capacitor module.

Description of the Related Art

Hitherto, there has been known a power converter in which a semiconductor module as a heat generating component is connected to a capacitor module via a bus bar. In the related art power converter thus configured, heat generated in the semiconductor module is liable to be transferred to the capacitor module via the bus bar. Accordingly, in the related art power converter, a temperature of a capacitor element included in the capacitor module is liable to increase, and thus the capacitor module tends to have a shorter lifetime.

Meanwhile, there has hitherto been proposed a power converter in which, a shared cooler is attached to each of the semiconductor module and the capacitor module so as to suppress a temperature increase in each of a semiconductor module and a capacitor module (see, for example, Patent Literature 1).

CITATION LIST

Patent Literature

[PTL 1] JP 2013-146179 A

SUMMARY OF THE INVENTION

In a power converter, it is preferred to bring a position of a capacitor module closer to a position of a semiconductor module and reduce an inductance of a bus bar so as to improve performance of the power converter. However, in the related-art power converter disclosed in Japanese Patent Application Laid-Open No. 2013-146179, when the capacitor module is brought closer to the semiconductor module, the capacitor module is arranged within a range of the cooler in which a temperature is increased under the influence of heat generation from the semiconductor module. As a result, in the related-art power converter, the capacitor module is less likely to be cooled by the cooler.

The present invention has been achieved to solve a problem as described above. An object of the present invention is to provide a power converter capable of improving its performance, and also allowing each of a semiconductor module and a capacitor module to be more reliably cooled.

According to at least one embodiment of the present invention, there is provided a power converter including: a cooler having a cooling surface formed therein; a semiconductor module provided on the cooling surface; and a capacitor module including a capacitor module main body facing the cooling surface, while being apart from the cooling surface, and a heat conductive member provided in the capacitor module main body, the capacitor module main body being connected to the semiconductor module via a bus bar, the heat conductive member having a heat radiation portion, the heat radiation portion being thermally connected to the cooling surface at a position more distant from the semiconductor module than an end portion of the capacitor module main body which is closer to the semiconductor module.

The power converter according to the at least one embodiment of the present invention is capable of improving its performance, and also allowing each of the semiconductor module and the capacitor module to be more reliably cooled.

DESCRIPTION OF THE EMBODIMENTS

Figure 1:
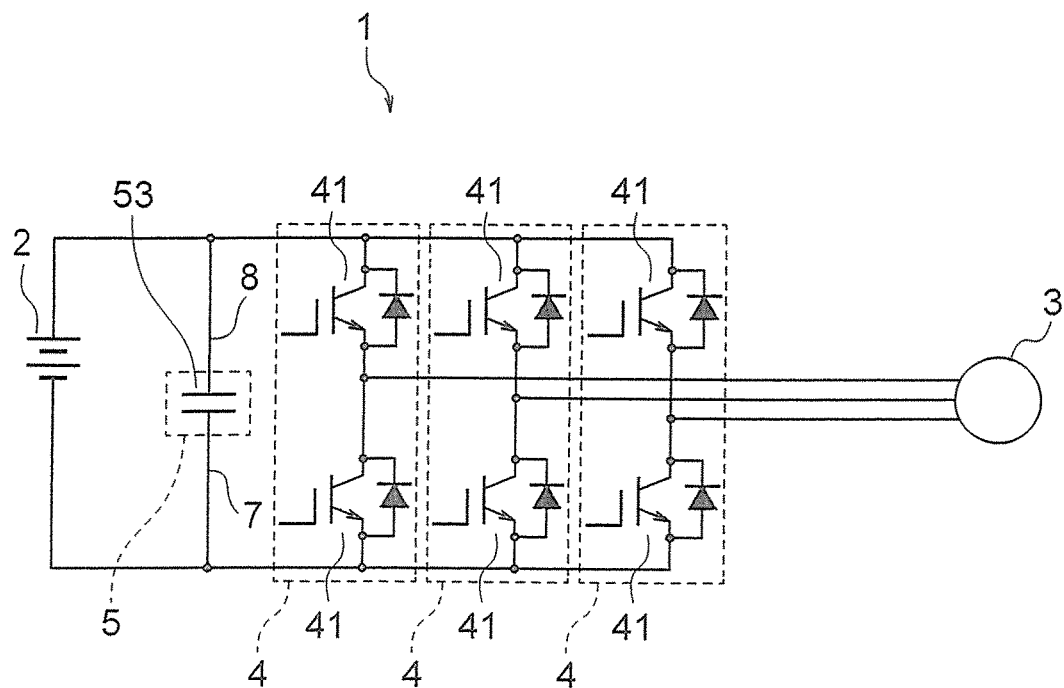
FIG. 1 is a circuit diagram for illustrating a power converter according to a first embodiment of the present invention.

Referring to the drawings, embodiments of the present invention are described below.

First Embodiment

Figure 2:
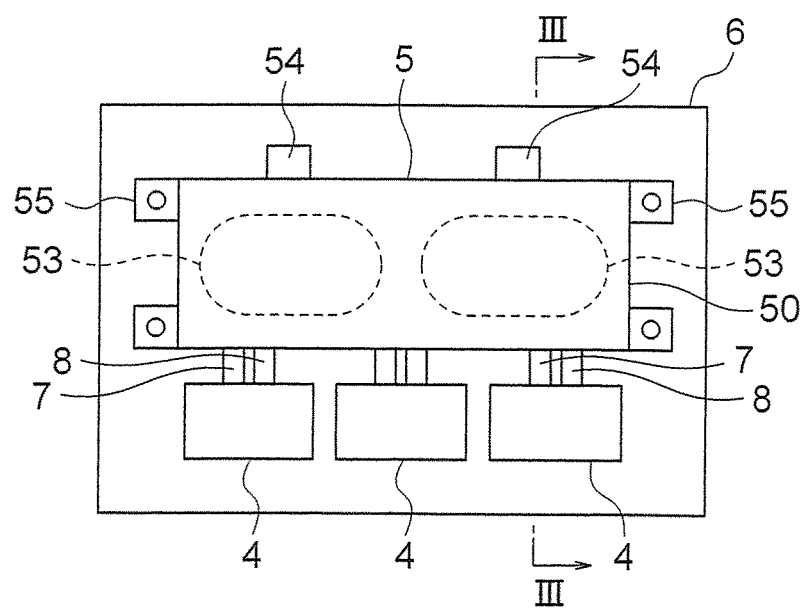
FIG. 2 is a top view for illustrating the power converter of FIG. 1.
Figure 3:
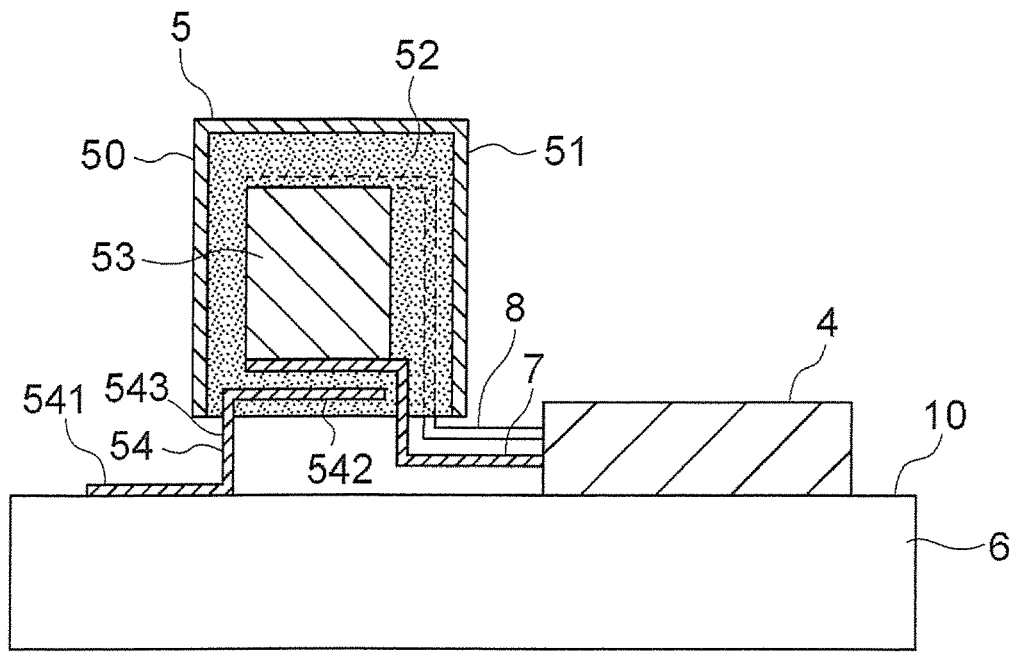
FIG. 3 is a sectional view taken along the line of FIG. 2.

FIG. 1 is a circuit diagram for illustrating a power converter according to a first embodiment of the present invention. FIG. 2 is a top view for illustrating the power converter of FIG. 1. FIG. 3 is a sectional view taken along the line III-III of FIG. 2. A power converter 1 is configured to convert electric energy between a power source and a load. In this example, a vehicular power converter to be mounted in a vehicle, such as a hybrid vehicle or an electric vehicle, is used as the power converter 1.

The power converter 1 includes a plurality of semiconductor modules 4, a capacitor module 5, and a cooler 6. In this example, the three semiconductor modules 4 individually corresponding to three phases are included in the power converter 1.

The capacitor module 5 is electrically connected to a battery 2 as a DC power source. A DC voltage from the battery 2 is smoothed by the capacitor module 5.

For the capacitor module 5, N-side bus bars 7 and P-side bus bars 8 are provided as a plurality of bus bars. Each of the N-side bus bars 7 and the P-side bus bars 8 is formed of a conductive material, for example, copper. The capacitor module is electrically connected individually to each of the semiconductor modules 4 via the N-side bus bar 7 and the P-side bus bar 8. The capacitor module 5 is also thermally connected to each of the semiconductor modules 4 via the N-side bus bar 7 and the P-side bus bar 8.

Each of the semiconductor modules 4 converts the DC voltage smoothed by the capacitor module 5 to an AC voltage. As illustrated in FIG. 1, each of the semiconductor modules 4 includes a plurality of switching elements 41. In this example, the two switching elements 41 connected in series to each other are included in each of the semiconductor modules 4. Of the two switching elements 41 of the semiconductor module 4, one is connected to the N-side bus bar 7 and another is connected to the P-side bus bar 8.

Each of the switching elements 41 individually performs a switching operation under the control of a control device (not shown). Accordingly, each of the semiconductor modules 4 is a heat generating component that generates heat as a result of the switching operation performed by each of the switching elements 41. The DC voltage smoothed by the capacitor module 5 is converted to a three-phase AC voltage by the switching operation performed by each of the switching elements 41.

Each of the semiconductor modules 4 is electrically connected to a motor 3 serving as a load. The motor 3 operates with a supply of the three-phase AC voltage from each of the semiconductor modules 4 to the motor 3.

The cooler 6 is configured to cool the semiconductor modules 4 and the capacitor module 5. In the cooler 6, as illustrated in FIG. 3, a cooling surface 10 is formed. Further, in the cooler 6, a flow path (not shown) in which a cooling medium flows is formed. The cooling medium enters the flow path of the cooler 6 from a flow path inlet of the cooler 6. The cooling medium flowing through the flow path of the cooler 6 is discharged from a flow path outlet of the cooler 6 to the outside of the cooler 6.

The cooling surface 10 is cooled by the cooling medium flowing through the cooler 6. As the cooling medium, water, oil, air, or the like is used. In this example, an air-cooling cooler using air as the cooling medium is used as the cooler 6.

The semiconductor modules 4 are provided on the cooling surface 10. An outer surface of each of the semiconductor modules 4 has a portion in contact with the cooling surface 10. Thus, each of the semiconductor modules 4 is thermally connected to the cooling surface 10. Heat generated in the semiconductor module 4 is radiated to the cooling surface 10. Thus, the semiconductor module 4 is cooled. The heat transferred to the cooling surface 10 is radiated into the cooling medium flowing in the cooler 6.

The capacitor module 5 includes a capacitor module main body 50 and a plurality of heat conductive members 54 provided in the capacitor module main body 50.

The capacitor module main body 50 is arranged apart from each of the semiconductor modules 4. Further, the capacitor module main body 50 is electrically and thermally connected to each of the semiconductor modules 4 via the N-side bus bar 7 and the P-side bus bar 8. Further, the capacitor module main body 50 is arranged apart from the cooling surface 10. Further, the capacitor module main body 50 also faces the cooling surface 10. As a result, between the capacitor module main body 50 and the cooling surface 10, a space is formed.

The capacitor module main body 50 includes a capacitor case 51, a plurality of capacitor elements 53 arranged in the capacitor case 51, and a filling member 52 which is made of a resin, and covers the plurality of capacitor elements 53 in the capacitor case 51.

As illustrated in FIG. 2, the capacitor case 51 is provided with a plurality of fixed portions 55. Each of the fixed portions 55 is fixed to the cooling surface 10. With this, a state in which the capacitor module main body 50 is apart from the cooling surface 10 is maintained. When the power converter 1 is viewed along a direction perpendicular to the cooling surface 10, a distance between each of the semiconductor modules 4 and each of the fixed portions 55 is larger than a distance between each of the semiconductor modules 4 and the capacitor module main body 50.

In the capacitor case 51, an opening is formed. In this example, the capacitor case 51 is arranged such that the opening thereof faces the cooling surface 10. In addition, an outer surface of the capacitor case 51 is exposed to external air. The capacitor case 51 is formed of metal having heat transfer performance. A thermal conductivity of the capacitor case 51 is higher than a thermal conductivity of the filling member 52.

Each of the N-side bus bars 7 and the P-side bus bars 8 is inserted into the capacitor case 51 through the opening of the capacitor case 51. Further, each of the N-side bus bars 7 and the P-side bus bars 8 extends through the filling member 52 to be connected to the corresponding capacitor element 53. Further, each of the N-side bus bars 7 and the P-side bus bars 8 is held in the capacitor case 51 via the filling member 52.

The filling member 52 fills the inside of the capacitor case 51. A part of each of the N-side bus bars 7, a part of each of the P-side bus bars 8, and each of the capacitor elements 53 are embedded in the filling member 52. Thus, the filling member 52 seals each of the capacitor elements 53 in the capacitor case 51. A resin as a material forming the filling member 52 is a material having heat transfer performance.

A part of heat generated in each of the semiconductor modules 4 is transferred through each of the N-side bus bar 7 and the P-side bus bar 8 and reaches the capacitor module main body 50. The part of heat transferred from each of the semiconductor modules 4 and reaching the capacitor module main body 50 is transferred through the filling member 52 and radiated from the outer surface of the capacitor case 51 to the external air.

Each of the heat conductive members 54 is formed of a material having the heat transfer performance. In this example, each of the heat conductive members 54 is formed of metal, for example, copper. Each of the heat conductive members 54 has a heat conductivity higher than the heat conductivity of the filling member 52. In this example, the heat conductive members 54 are arranged at positions away from each of the N-side bus bars 7, the P-side bus bars 8, the capacitor case 51, and the capacitor elements 53.

Each of the heat conductive members 54 has a plate-shaped heat radiation portion 541 in contact with the cooling surface 10, a plate-shaped attachment portion 542 attached to the capacitor module main body 50, and a joint portion 543 joining the heat radiation portion 541 to the attachment portion 542.

The attachment portion 542 is arranged in the capacitor module main body 50, while being embedded in the filling member 52. With this, each of the heat conductive members 54 is held in the capacitor case 51 via the filling member 52.

The joint portion 543 extends from the attachment portion 542 to the outside of the capacitor case 51 through the opening of the capacitor case 51. The joint portion 543 also extends from the inside of the filling member 52 to the outside of the filling member 52 toward the cooling surface 10. With this, heat in the capacitor module main body 50 is transferred to the outside of the capacitor module main body 50 through each of the attachment portion 542 and the joint portion 543. The joint portion 543 is also joined to the heat radiation portion 541 at the cooling surface 10.

The heat radiation portion 541 is arranged at a position away from the capacitor module main body 50. The heat radiation portion 541 is also in contact with the cooling surface 10 to be thermally connected to the cooling surface 10. With this, the heat in the capacitor module main body 50 is radiated to the cooling surface 10 through each of the heat conductive members 54.

Further, the heat radiation portion 541 is in contact with the cooling surface 10 at a position distant from each of the semiconductor modules 4 than an end portion of the capacitor module main body 50 which is closer to the semiconductor module 4. In other words, when the power converter 1 is viewed along a direction perpendicular to the cooling surface 10, a distance between each of the semiconductor modules 4 and the heat radiation portion 541 is longer than a distance between each of the semiconductor modules 4 and the capacitor module main body 50.

Further, the heat radiation portion 541 extends from the joint portion 543 to the opposite side of each of the semiconductor modules 4 along the cooling surface 10. Consequently, the heat radiation portion 541 has a portion reaching a position more distant from the semiconductor module 4 than a region of the cooling surface 10 facing the capacitor module main body 50. In other words, when the power converter 1 is viewed along the direction perpendicular to the cooling surface 10, the heat radiation portion 541 has a portion protruding from the region of the capacitor module main body 50 to the opposite side of the semiconductor module 4, as illustrated in FIG. 2.

The capacitor module main body 50 and each of the semiconductor modules 4 are arranged in a direction of the flow of the cooling medium flowing in the cooler 6. The heat radiation portion 541 is in contact with the cooling surface 10 at a position upstream of a position of the corresponding semiconductor module 4 in the flow of the cooling medium. In other words, the heat radiation portion 541 is in contact with the cooling surface 10 at the position closer to the flow path inlet of the cooler 6 than the position of the corresponding semiconductor module 4. Accordingly, the cooling medium flowing in the cooler 6 absorbs heat from the heat radiation portion 541 and then absorbs heat from the corresponding semiconductor module 4.

When a length of each of the N-side bus bars 7 and the P-side bus bars 8 is reduced by bringing the capacitor module main body 50 closer to each of the semiconductor modules 4, an inductance of each of the N-side bus bars 7 and the P-side bus bars 8 is reduced. With this, performance of the power converter 1 is improved. Accordingly, it is preferred that the position of the capacitor module main body 50 be closest to each of the semiconductor modules 4.

On the other hand, around each of the semiconductor modules 4, a temperature of the cooling surface 10 is increased by the heat generated in each semiconductor module 4. In particular, when an air-cooling cooler having a low cooling ability is used as the cooler 6, the temperature of the cooling surface 10 tends to be increased around each of the semiconductor modules 4. Accordingly, when the capacitor module main body 50 is brought into contact with the cooling surface 10 at a position close to each of the semiconductor modules 4, the capacitor module main body 50 comes into contact with the cooling surface 10 having the increased temperature. In this case, heat cannot be efficiently radiated from the capacitor module main body 50 to the cooling surface 10.

However, in the power converter 1 according to the first embodiment, the capacitor module main body 50 is away from the cooling surface 10. Accordingly, it is possible to prevent the transfer of heat generated in each of the semiconductor modules 4 to the capacitor module main body 50 via the cooling surface 10. With this, the position of the capacitor module main body 50 can be brought closer to each of the semiconductor modules 4. Therefore, it is possible to reduce the inductance of each of the N-side bus bars 7 and the P-side bus bars 8 and improve the performance of the power converter 1.

In addition, the heat radiation portion 541 is in contact with the cooling surface 10 at the position more distant from each of the semiconductor modules 4 than the end portion of the capacitor module main body 50 closer to the semiconductor module 4. Thus, the heat radiation portion 541 can be brought into contact with the cooling surface 10 at a position at which the cooling surface 10 is less likely to be affected by the heat from each of the semiconductor modules 4. As a result, it is possible to efficiently dissipate the heat in the capacitor module main body 50 from the heat radiation portion 541 to the cooling surface 10. Therefore, it is possible to more reliably cool not only each of the semiconductor modules 4, but also the capacitor module 5.

Moreover, the heat radiation portion 541 is in contact with the cooling surface 10 at the position upstream of the position of each of the semiconductor modules 4 in the flow of the cooling medium cooling the cooling surface 10. With this, the heat radiation portion 541 can be brought into contact with the cooling surface 10 at a position at which the cooling medium flows before absorbing heat from each of the semiconductor modules 4. Consequently, it is possible to maintain the cooling surface 10 at a position at which the heat radiation portion 541 is in contact therewith in a low temperature state and allow the heat in the capacitor module main body 50 to be more efficiently radiated from the heat radiation portion 541 to the cooling surface 10. Therefore, it is possible to more reliably cool the capacitor module 5.

Each of the heat conductive members 54 has the attachment portion 542 arranged in the capacitor module main body 50. Accordingly, it is possible to efficiently transfer heat in the capacitor module main body 50 to the outside of the capacitor module main body 50 through the heat conductive members 54. With this, the capacitor module 5 can be more reliably cooled. In addition, the heat conductive members 54 can be integrated with the capacitor module main body 50. Consequently, upon manufacturing the power converter 1, it is possible to handle the capacitor module main body 50 and the heat conductive members 54 as one component. This can facilitate an operation of manufacturing the power converter 1.

Each of the N-side bus bars 7 and the P-side bus bars 8 is connected to the capacitor element 53 through the filling member 52. In addition, each of the N-side bus bars 7 and the P-side bus bars 8 is also held in the capacitor case 51 via the filling member 52. Accordingly, it is possible to allow the filling member 52 to transfer, to the capacitor case 51, a part of the heat that has been transferred from each of the semiconductor modules 4 through the N-side bus bar 7 and the P-side bus bar 8 and has reached the capacitor module main body 50. Thus, it is possible to dissipate the heat from the capacitor case 51 to the external air and more reliably suppress a temperature increase in the capacitor module 5.

Second Embodiment

Figure 4:
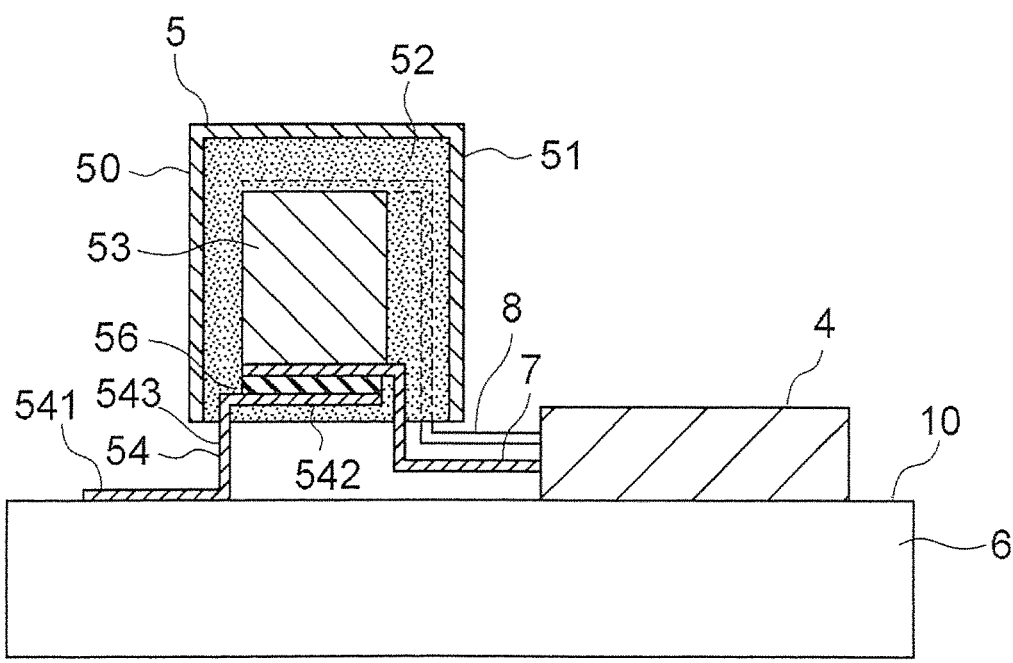
FIG. 4 is a sectional view for illustrating a power converter according to a second embodiment of the present invention.

FIG. 4 is a sectional view for illustrating a power converter according to a second embodiment of the present invention. Between each of the N-side bus bars 7 and the attachment portion 542, an insulating paper sheet 56 as an insulating member different from the filling member 52 is interposed. As a result, the attachment portion 542 of each of the heat conductive members 54 is arranged under the N-side bus bar 7 via the insulating paper sheet 56 in the capacitor case 51. The insulating paper sheet 56 has a heat conductivity higher than the heat conductivity of the filling member 52. The insulating paper sheet 56 is an insulating member having electrical insulation performance. The electrical insulation performance of the insulating paper sheet 56 is higher than electrical insulation performance of the filling member 52.

A part of the heat transferred to each of the N-side bus bars 7 is transferred to the attachment portion 542 via the insulating paper sheet 56. The heat transferred from the N-side bus bar 7 to the attachment portion 542 is radiated to the cooling surface 10 through each of the joint portion 543 and the heat radiation portion 541. Other configurations are the same as those of the first embodiment.

In the power converter 1 thus configured, the insulating paper sheet 56 having the heat conductivity higher than that of the filling member 52 is interposed between the attachment portion 542 of each of the heat conductive members 54 and the corresponding N-side bus bar 7. This allows easier heat transfer from the N-side bus bar 7 to the heat conductive member 54. Therefore, it is possible to more efficiently dissipate the heat in the capacitor module main body 50 to the cooling surface 10.

In the example described above, as the insulating member interposed between the attachment portion 542 and the N-side bus bar 7, the insulating paper sheet 56 is used. However, the insulating member interposed between the attachment portion 542 and the N-side bus bar 7 is not required to be the insulating paper sheet 56 as long as the insulating member has the heat conductivity higher than that of the filling member 52. Accordingly, a heat conductive sheet made of a resin, a ceramic plate, or the like may also be used as the insulating member.

Figure 8:
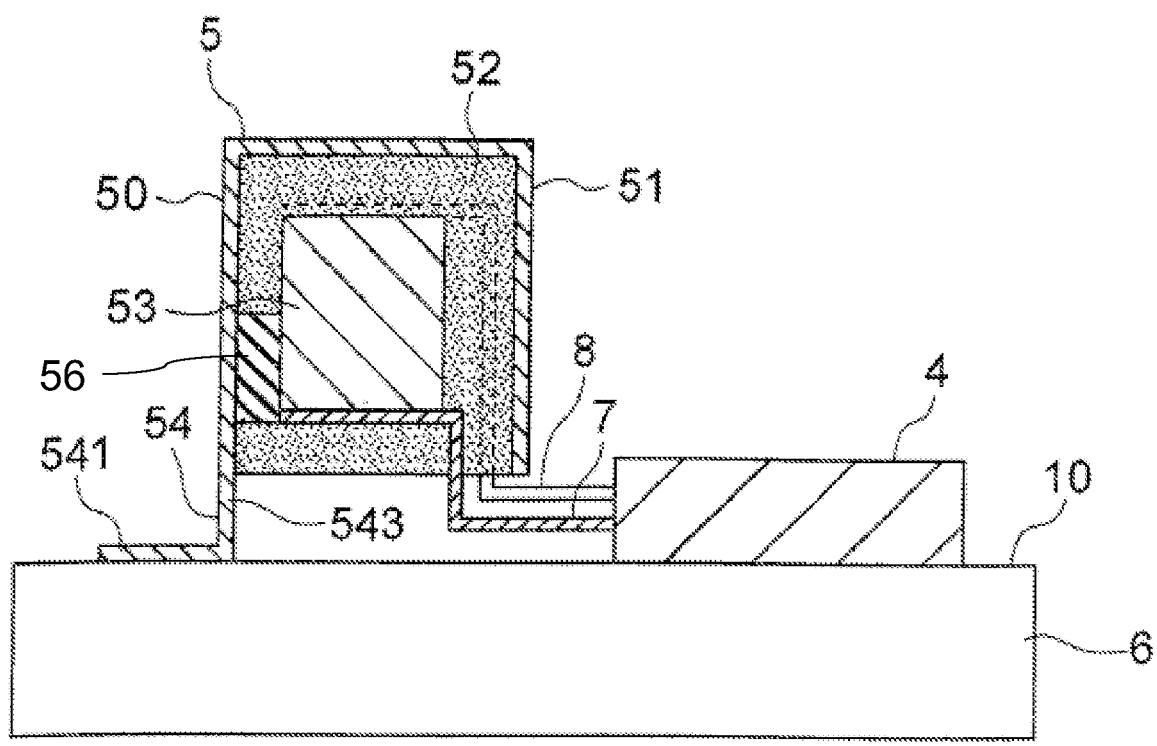
FIG. 8 is a sectional view for illustrating a power converter.

Further, in the example described above, the insulating paper sheet 56 is interposed between the attachment portion 542 and the N-side bus bar 7. However, it is also possible, as illustrated in FIG. 8, to dispose the attachment portion 542 in the capacitor case 51 such that the attachment portion 542 faces the corresponding P-type bus bar 8, and to interpose the insulating paper sheet 56 between the attachment portion 542 and the P-side bus bar 8. Alternatively, it is also possible, as illustrated in FIG. 8, to dispose the attachment portion 542 in the capacitor case 51 such that the attachment portion 542 faces the corresponding capacitor element 53, and to interpose the insulating paper sheet 56 between the attachment portion 542 and the capacitor element 53. Such configurations also allow the heat in the capacitor module main body 50 to be more efficiently dissipated to the cooling surface 10. By thus interposing the insulating paper sheet 56 between the attachment portion 542 and at least any one of the N-side bus bar 7, the P-side bus bar 8, and the capacitor element 53, it is possible to more efficiently dissipate the heat in the capacitor module main body 50 to the cooling surface 10.

Third Embodiment

Figure 5:
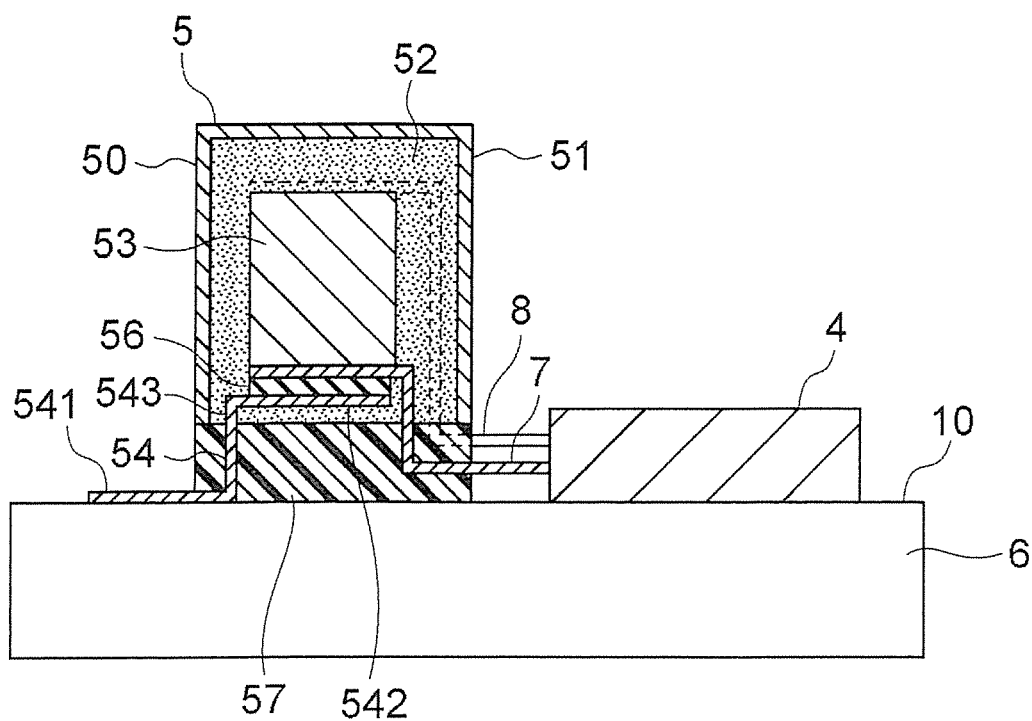
FIG. 5 is a sectional view for illustrating a power converter according to a third embodiment of the present invention.

FIG. 5 is a sectional view for illustrating a power converter according to a third embodiment of the present invention. Between the capacitor module main body 50 and the cooling surface 10, a heat insulating member 57 is interposed. In addition, the capacitor module main body 50 is supported by the cooling surface 10 via the heat insulating member 57.

The heat insulating member 57 is formed of a material having a heat conductivity lower than that of the capacitor module main body 50. In other words, the heat insulating member 57 is formed of a material having a heat conductivity lower than those of the capacitor case 51, the filling member 52, and the capacitor elements 53. As the material forming the heat insulating member 57, a resin, rubber, or the like is used. Other configurations are the same as those of the second embodiment.

In the power converter 1 thus configured, the heat insulating member 57 formed of the material having the heat conductivity lower than that of the capacitor module main body 50 is interposed between the capacitor module main body 50 and the cooling surface 10. With this, the heat insulating member 57 can more reliably suppress heat transfer from the cooling surface 10 to the capacitor module main body 50. Consequently, each of the semiconductor modules 4 and the capacitor module 5 can more reliably be cooled. This also allows the heat insulating member 57 to stably support the capacitor module main body 50 with respect to the cooling surface 10. As a result, it is possible to improve anti-vibration performance of the power converter 1, and prevent occurrence of a failure in the power converter 1.

Fourth Embodiment

Figure 6:
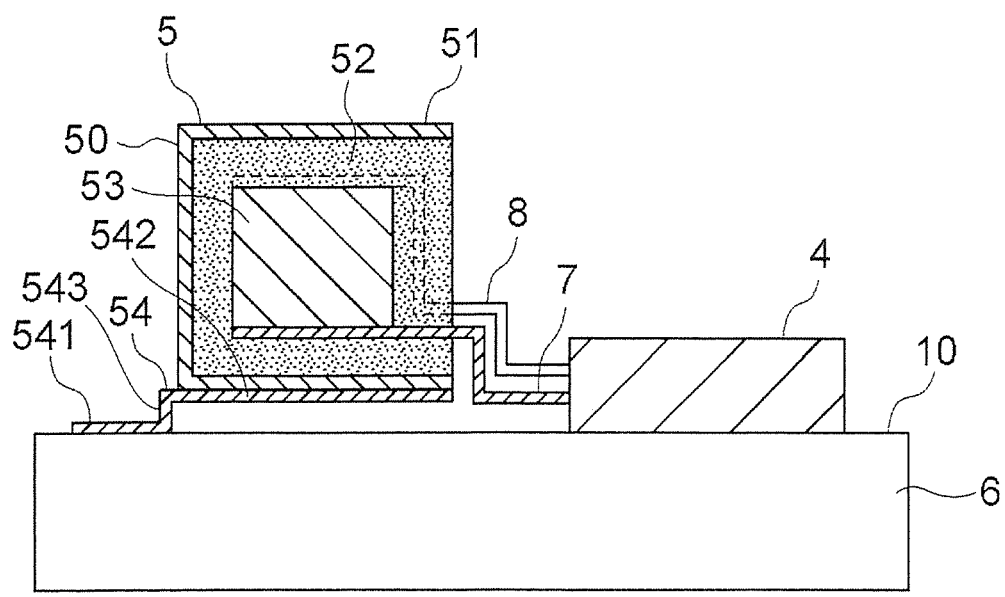
FIG. 6 is a sectional view for illustrating a power converter according to a fourth embodiment of the present invention.

FIG. 6 is a sectional view for illustrating a power converter according to a fourth embodiment of the present invention. The attachment portion 542 of each of the heat conductive members 54 is attached to an outer surface of the capacitor module main body 50. The attachment portion 542 is also in contact with the outer surface of the capacitor module main body 50. Through the contact with the outer surface of the capacitor module main body 50, the attachment portion 542 is thermally connected to the outer surface of the capacitor module main body 50. In this example, the attachment portion 542 is in contact with the outer surface of the capacitor case 51. Accordingly, in this example, the heat conductive members 54 are not inserted into the capacitor module main body 50.

The capacitor case 51 is arranged with the opening thereof facing each of the semiconductor modules 4. Consequently, the outer surface of the capacitor case 51 has a portion facing the cooling surface 10.

Each of the attachment portions 542 is attached to a part of the outer surface of the capacitor case 51 facing the cooling surface 10. The heat in the capacitor module main body 50 is radiated from the capacitor case 51 to the cooling surface 10 through the heat conductive members 54. Other configurations are the same as those of the first embodiment.

Even when the attachment portion 542 of each of the heat conductive members 54 is thus attached to the outer surface of the capacitor module main body 50, it is possible to allow the heat in the capacitor module main body 50 to be efficiently transferred to the heat conductive member 54. With this, the capacitor module main body 50 can be more reliably cooled.

In the example described above, each of the attachment portions 542 is in contact with the outer surface of the capacitor module main body 50. However, the attachment portion 542 may be also attached to the outer surface of the capacitor module main body 50 via an adhesive member having heat transfer performance. In this case, the adhesive member is in close contact with each of the outer surface of the capacitor module main body 50 and the attachment portion 542 with no gap formed therebetween. Further, in this case, the attachment portion 542 is attached to the outer surface of the capacitor module main body 50 via the adhesive member to be thermally connected to the outer surface of the capacitor module main body 50. As the adhesive member, heat-radiation grease, a heat conductive sheet made of a resin, or the like is used. It is preferred that the adhesive member have a heat conductivity higher than the respective heat conductivities of the capacitor case 51 and the heat conductive members 54. However, the heat conductivity of the adhesive member may be the same as or lower than the respective heat conductivities of the capacitor case 51 and the heat conductive members 54. With this, a gap formed between the outer surface of the capacitor module main body 50 and each of the attachment portions 542 can be filled with the adhesive member, and the heat in the capacitor module main body can be more efficiently transferred to each of the heat conductive members 54. As a result, it is possible to more reliably cool the capacitor module main body 50.

In the example described above, the capacitor module main body 50 is arranged with the opening of the capacitor case 51 facing each of the semiconductor modules 4. However, the opening of the capacitor case 51 may also face the cooling surface 10.

Fifth Embodiment

Figure 7:
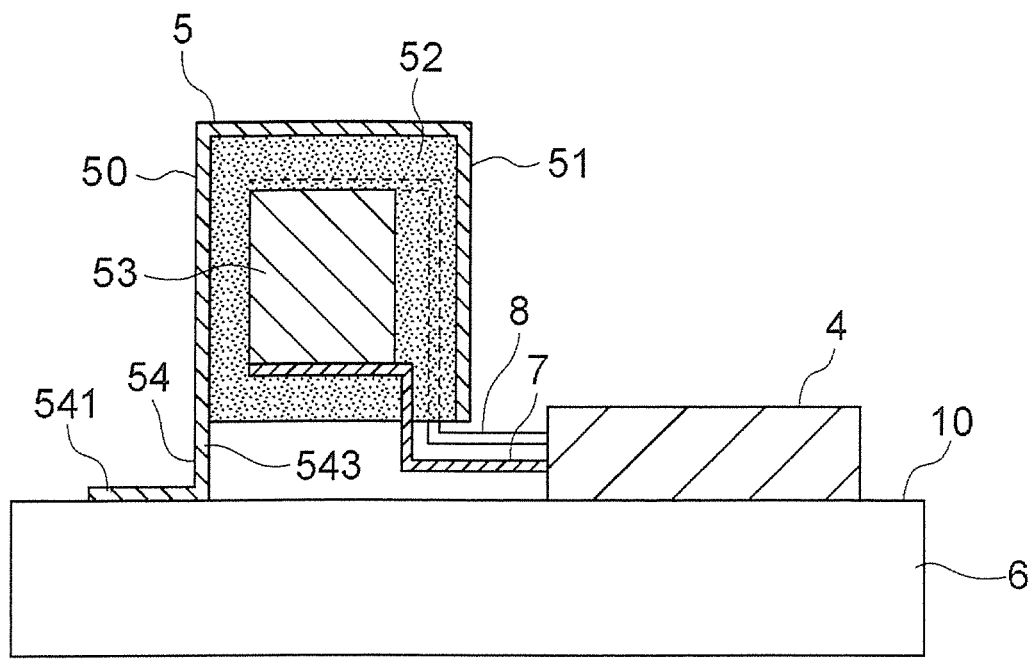
FIG. 7 is a sectional view for illustrating a power converter according to a fifth embodiment of the present invention.

FIG. 7 is a sectional view for illustrating a power converter according to a fifth embodiment of the present invention. Each of the heat conductive members 54 is formed integrally with the capacitor case 51. In addition, the capacitor case 51 is formed of the same material as that of the heat conductive members 54. Specifically, a single member has a portion serving as the capacitor case 51 and another portion serving as the heat conductive members 54. As a material for forming the capacitor case 51 and the heat conductive member 54, metal having high heat transfer performance, for example, aluminum, is used. The member in which the capacitor case 51 and the heat conductive members 54 are integrated has a heat conductivity higher than the heat conductivity of the filling member 52.

Each of the heat conductive members 54 protrudes from an edge portion of the opening of the capacitor case 51 toward the cooling surface 10. The heat conductive member 54 has the plate-shaped heat radiation portion 541 in contact with the cooling surface 10 and the joint portion 543 joining the heat radiation portion 541 to the capacitor case 51. The respective configurations of the heat radiation portion 541 and the joint portion 543 are the same as those in the first embodiment. Other configurations are also the same as those of the first embodiment.

In the power converter 1 thus configured, the heat conductive members 54 are formed integrally with the capacitor case 51. Accordingly, it is possible to handle the capacitor case 51 and the heat conductive members 54 as one component and reduce the number of the components. This can facilitate the operation of manufacturing the power converter 1.

In the example described above, between the capacitor case 51 and each of the N-side bus bar 7, the P-side bus bar 8, and the capacitor element 53, the filling member 52 is interposed. However, as shown in FIG. 8, it is also possible to interpose an insulating member different from the filling member 52 between the capacitor case 51 and at least any one of the N-side bus bar 7, the P-side bus bar 8, and the capacitor element 53. In this case, a member having a heat conductivity higher than that of the filling member 52 is used as the insulating member. Further, in this case, the member having electric insulation performance higher than that of the filling member 52 is used as the insulating member. As the insulating member, an insulating paper sheet 56, a heat conductive sheet made of a resin, a ceramic plate, or the like is used. This allows easy heat transfer from at least any one of the N-side bus bar 7, the P-side bus bar 8, and the capacitor element 53 to the capacitor case 51 and to the heat conductive member 54. Accordingly, it is possible to more efficiently dissipate the heat in the capacitor module main body 50 to the cooling surface 10.

The third embodiment is obtained by applying the heat insulating member 57 to the power converter 1 of the second embodiment. However, it is also possible to apply the heat insulating member 57 to the power converter 1 of the first, fourth, or fifth embodiment.

In each of the embodiments described above, the heat radiation portion 541 is in contact with the cooling surface 10. However, the heat radiation portion 541 may also be arranged over the cooling surface 10 via a heat conductive material having heat transfer performance. In this case, the heat radiation portion 541 is thermally connected to the cooling surface 10 via the heat conductive material. Further, in this case, the heat conductive material is interposed between the heat radiation portion 541 and the cooling surface 10, while being in close contact with each of the heat radiation portion 541 and the cooling surface 10 with no gap formed therebetween. As the heat conductive material, heat-radiation grease, a heat conductive sheet made of a resin, or the like is used. It is preferred that the heat conductive material have a heat conductivity higher than that of each of the heat conductive members 54. However, the heat conductivity of the heat conductive material may also be the same as or lower than the heat conductivity of each of the heat conductive members 54. By thus setting the heat conductivity of the heat conductive material, it is possible to fill a gap formed between the heat radiation portion 541 and the cooling surface 10 with the heat conductive material, and allow the heat from the heat radiation portion 541 to be more efficiently transferred to the cooling surface 10. As a result, it is possible to more efficiently dissipate the heat in the capacitor module main body 50 to the cooling surface 10.

Further, in each of the embodiments described above, the heat radiation portion 541 is thermally connected to the cooling surface 10 at a position upstream of the position of the corresponding semiconductor module 4 in the flow of the cooling medium. However, the position of the heat radiation portion 541 is not limited to the position upstream of the position of the corresponding semiconductor module 4 in the flow of the cooling medium. For example, it is also possible to thermally connect the heat radiation portion 541 to the cooling surface 10 at a position displaced from the position of the corresponding semiconductor module 4 in a direction perpendicular to a direction of the flow of the cooling medium.

Further, in each of the embodiments described above, the heat radiation portion 541 has a portion arranged at a position more distant from each of the semiconductor modules 4 than the region of the cooling surface 10 facing the capacitor module main body 50. However, it is also possible to dispose the whole heat radiation portion 541 at a position more distant from each of the semiconductor modules 4 than the region of the cooling surface 10 facing the capacitor module main body 50.

What is claimed is:

1. A power converter comprising:
a cooler having a cooling surface formed therein;
a semiconductor module provided on the cooling surface; and
a capacitor module including:
   a capacitor module main body facing the cooling surface at a distance from the cooling surface and connected to the semiconductor module via a bus bar, and
   a heat conductive member connected to the capacitor module main body and having a heat radiation portion thermally connected to the cooling surface at a position more distant from the semiconductor module than an end portion of the capacitor module main body that is closest to the semiconductor module,
wherein:
the heat radiation portion is the only portion of the heat conductive member that is directly in contact with the cooling surface, and an entire length of the heat radiation portion is thermally connected to the cooling surface,
the capacitor module main body includes a capacitor case, a capacitor element arranged in the capacitor case, and a filling member which is made of a resin, and covers the capacitor element in the capacitor case;
the bus bar extends through the filling member to be connected to the capacitor element, while being held in the capacitor case via the filling member
wherein:
the capacitor case is formed of the same material as that of the heat conductive member; and
the heat conductive member is integral with the capacitor case wherein, between the capacitor case and at least one of the capacitor element and the bus bar, an insulating member having a heat conductivity higher than that of the filling member is interposed.

2. A power converter comprising:
a cooler having a cooling surface formed therein;
a semiconductor module provided on the cooling surface; and
a capacitor module including:
   a capacitor module main body facing the cooling surface at a distance from the cooling surface and connected to the semiconductor module via a bus bar, and
   a heat conductive member connected to the capacitor module main body and having a heat radiation portion thermally connected to the cooling surface at a position more distant from the semiconductor module than an end portion of the capacitor module main body that is closest to the semiconductor module,
wherein:
the heat radiation portion is the only portion of the heat conductive member that is directly in contact with the cooling surface, and an entire length of the heat radiation portion is thermally connected to the cooling surface,
the capacitor module main body includes a capacitor case, a capacitor element arranged in the capacitor case, and a filling member which is made of a resin, and covers the capacitor element in the capacitor case;
the bus bar extends through the filling member to be connected to the capacitor element, while being held in the capacitor case via the filling member
wherein:
the heat conductive member has an attachment portion arranged inside the filling member; and
between the attachment portion and at least one of the capacitor element and the bus bar, an insulating member having a heat conductivity higher than that of the filling member is interposed.

3. The power converter according to claim 2, wherein:
the cooling surface is cooled by a cooling medium flowing in the cooler; and
the heat radiation portion is thermally connected to the cooling surface at a position upstream of a position of the semiconductor module in a flow of the cooling medium.

4. The power converter according to claim 2, wherein, between the capacitor module main body and the cooling surface, a heat insulating member formed of a material having a heat conductivity lower than that of the capacitor module main body is interposed.

5. The power converter according to claim 2, wherein the heat conductive member has an attachment portion arranged inside the capacitor module main body.

* * * * *